United States Patent
Jensen et al.

(10) Patent No.: US 7,419,394 B2
(45) Date of Patent: Sep. 2, 2008

(54) ELECTRICAL SYSTEM HAVING WITHDRAWABLE UNIT WITH MAINTAINED CONTROL AND COMMUNICATION CONNECTION

(75) Inventors: David L. Jensen, Barneveld, WI (US); Chester Malkowski, Jr., Franklin, WI (US); David T. Rollay, Franklin, WI (US); Sandra J. Tietyen, Cedarburg, WI (US); Arnaldo Hiroyuki Omoto, São Paulo (BR); Herberto Bergmann, São Paulo (BR)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 11/271,713

(22) Filed: Nov. 11, 2005

(65) Prior Publication Data

US 2007/0111575 A1 May 17, 2007

(51) Int. Cl.
*H01R 13/64* (2006.01)

(52) U.S. Cl. .................................... 439/248; 439/924.1

(58) Field of Classification Search .......... 439/246–248
See application file for complete search history.

(56) References Cited

U.S. PATENT DOCUMENTS 4,967,311 A * 10/1990 Ferchau et al. ............... 439/246
5,344,332 A    9/1994 Lopez et al.
6,592,387 B2 * 7/2003 Komenda et al. ............ 439/248
2002/0081881 A1  6/2002 Komenda et al.
2005/0070166 A1 * 3/2005 Brandt et al. ................ 439/638

FOREIGN PATENT DOCUMENTS

EP    1521511    4/2005

* cited by examiner

*Primary Examiner*—Felix O. Figueroa
(74) *Attorney, Agent, or Firm*—Fletcher Yoder; Alexander R. Kuszewski

(57) ABSTRACT

A connector arrangement for packaged electrical systems, such as motor control centers includes a component connector assembly mounted to component supports for providing network signals and control power to components on the support. A mating prewired connector assembly in the enclosure is forced to mate with the component connector assembly when the component support is fully engaged within the enclosure. Thereafter, the component support may be partially withdrawn from the enclosure to disconnect main power from the component support, while leaving network connections and control power connections by virtue of the mated connectors. The connectors engage by non-sliding contact both when fully engaged and when the components are partially withdrawn from the enclosure.

20 Claims, 7 Drawing Sheets

ELECTRICAL SYSTEM HAVING WITHDRAWABLE UNIT WITH MAINTAINED CONTROL AND COMMUNICATION CONNECTION

BACKGROUND

The present invention relates generally to the field of packaged electrical components, and more particularly to a novel connector arrangement and system for interconnecting supported components in an enclosure with prewired connectors within the enclosure.

A wide range of packaged electrical and electronic systems have been developed that control industrial, commercial, marine and other processes. In general, such systems include both electronic monitoring and control equipment, as well as switchgear, controllers, and other power electronic equipment that drive loads. In an industrial setting, for example, motor control centers (MCCs) are large systems that house component supports or "buckets" within enclosures. The enclosures may be grouped into separate bays such that particular circuit portions may be supported on the component supports within different bays. The components typically include computer devices, such as programmable logic controllers, but also power electronic devices, such as inverter drives, motor starters, and so forth. Protective circuitry, including fuses, circuit breakers, and so forth are typically also included, along with conventional switchgear, such as relays and contactors. All of these circuit components are ultimately supported on component supports accessible through doors of the enclosures.

A particular issue that arises in some packaged electrical systems is the access to the components, and provision of network and power signals to the components even when they are not enabled for driving loads. In a typical MCC, for example, network signals, control power signals, and three phase power are all typically provided to components in the component supports. The three phase power is ultimately applied to the controlled loads. The control power is used to energize components within the system, such as relays, contactors, and so forth. The network signals serve to control such switchgear, and to exchange signals between the system and remote components and monitoring equipment.

Systems have been developed that can provide for network signals and control power when main power is disabled or disconnected from component supports in such systems. In one known system, for example, a sliding connector is used between the component supports and mating connectors within the enclosure. This sliding connector maintains contact between the conductors within the enclosure and the component support (and therethrough, the components). Conventional stabs extending from the component supports, however, can be disconnected from buses that route the main power through the enclosure. Thus, by partially extracting the component supports from their fully-engaged position, main power can be disconnected, while nevertheless providing network signals and control power for maintenance, testing, and servicing of the components supported by the component supports.

A drawback in such conventional systems is the use of a sliding connector system. During initial installation, such connectors often perform quite well, although their performance degrades over time. As the system ages, and particularly as the component support is withdrawn and reinserted into the enclosure, connections in the sliding assemblies may deteriorate, resulting in faulty signal transmission, and even bit errors in data transmission.

There is a need, therefore, for improved techniques for providing network signals and control power in packaged electrical systems. There is a particular need for a system that will provide reliable connections to network and control power conductors, and that does not suffer from the degradation over time consequent with sliding connector assemblies.

BRIEF DESCRIPTION

The present invention provides a package electrical power control system designed to respond to such needs. The system may be thought of as including an enclosure that houses electrical power component supports. A prewired connector assembly is disposed in the enclosure and is configured to receive data signals from a network and control power from a power source. One or more component supports are disposed in the enclosure. The component supports have a component connector assembly that is supported thereon and matable with one of the prewired connector assemblies of the enclosure. The connector assembly thus provides data signals and control power to components supported by the supports. The prewired connector assembly and the component connector assembly are biased towards a normal position, but movable within a predetermined range to maintain a non-sliding contact between the connector assemblies during displacement of the component supports in the enclosure.

In a present embodiment described below, the component connector assembly is formed of a base that is fixed to the component support, and a movable assembly that is secured to but movable with respect to the base. The movable assembly may be coupled to the base by means of disengagement members, such as pins or rods, and biased to the normal position by one or more compression springs. The two connector assemblies are made up by full engagement of the component support within the enclosure. Thereafter, withdrawal of the component support from the enclosure will not result in disengagement of the connector assemblies from one another until the predetermined range has been exceeded. At that point, the disengagement member will withdraw the component connector assembly from the prewired connector assembly.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
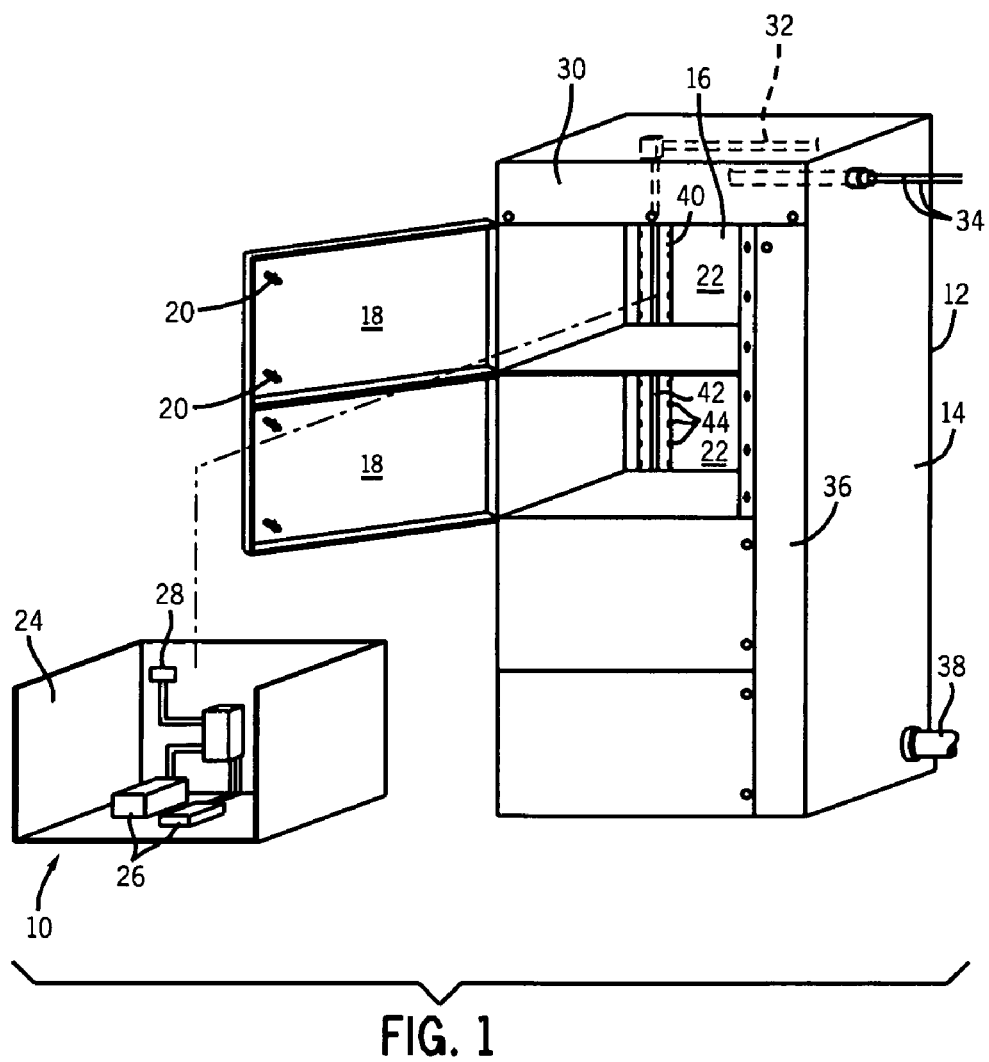
FIG. 1 is a perspective view of an exemplary packaged electrical system, such as an MCC, incorporating a connector arrangement in accordance with aspects of the invention.

Turning now to the drawings, and referring first to FIG. 1, a packaged electrical system 10 is illustrated as including an enclosure 12 that houses various electrical components. The enclosure will typically be formed of heavy gage sheet metal, although other enclosures, such as made of reinforced plastic may sometimes be used. The enclosure generally forms a shell 14 having a main interior volume 16 in which components and component supports are placed. The interior volume 16 may be subdivided into compartments that each receive particular components, typically components interconnected to form a portion of the overall process control or monitoring system. Each compartment may be accessed through main doors 18. Latches 20 are provided to hold the doors closed over the interior volume during operation.

Within each of the compartments, designated generally by reference numeral 22 in FIG. 1, component supports 24 may be disposed. As will be appreciated by those skilled in the art, the component supports 24 may be configured in various standard sizes or heights, and will typically comprise a metal drawer that can be slid into a compartment designed to accommodate the particular component support. On or within the component supports 24, a variety of components 26 are supported and interconnected. As noted above, such components may include electronic devices, such as programmable logic controllers, power electronic devices, such as motor controllers, inverter drives, and so forth, as well as switchgear, input/output interfaces, protective circuit components, and so forth. The components are generally designed to perform some control or monitoring function within an overall machine system. Accordingly, data signals are exchanged with the components and remote control and monitoring equipment or computers (not shown). Power signals are also provided to the components, as described in greater detail below, for enabling energization of such components such as relays, contactors, and so forth. Similarly, three phase power is typically provided to those components which will provide power to driven loads. Such loads may include motors, actuators, valves, and any other electrical load that may be present in the controlled or monitored process.

Within each component support 24, a component connector assembly 28 is supported. In the illustrated embodiment, the component connector assembly 28 is disposed on a rear wall of the support. As will be appreciated by those skilled in the art, such component connector assemblies may be provided on any suitable surface or support of the component support, such as a side panel, a lower or upper corner, and so forth. As described in greater detail below, the component connector assembly 28 will mate with a prewired connector assembly within the enclosure to provide network signals and control power to the components within the component support.

The enclosure 12 is particularly configured to pass network signals and control power through routing pads separated from other paths for main or three phase power. In the embodiment illustrated in FIG. 1, for example, an upper wireway or section 30 of the enclosure accommodates a network trunk cable 32 as well as conductors or cabling for control power, as indicated by reference numeral 34. The network trunk cable may be a shielded or flat media cable or any other suitable cable that is capable of transmitting data signals between the components and remote circuitry in accordance with standard network protocols. An exemplary protocol for MCCs, for example, is the DeviceNet protocol. The control power supplied by conductors 34 may be provided at various levels, depending upon the application. The conductors may be particularly configured, for example, to carry 110, 115, 220, or 230 volt, single phase power, 24 volt direct current power, 24 volt single phase power, and so forth.

A separate wireway 36 is provided in the enclosure for routing three phase power. In many applications, such power will be rated at 460 volt three phase, and may be provided in either three-wire configurations or four-wire configurations (including a neutral conductor). Such wiring will be routed through a main conduit 38 and connected within the backplane of the enclosure to main bus bars that are engaged by the component supports by conventional stab connections (not shown).

The embodiment shown in FIG. 1 provides a separate network and control power wireway 40 isolated from the main power wireway 36. Because of the lower power levels that would typically be present in the network conductor 32 and control power conductors 34, it has been found desirable to separate these wireways for initial installation and subsequent servicing needs. Accordingly, a network cable 42 is provided in the network and control power wireway 40, and is electrically coupled to conductors within the trunk cable assembly 32. Similar drop conductors (not shown) are provided for conductors coupled to the control power conductors 34. Where multiple sections or bays are provided in the system, the network trunk cable assembly 32 and the control power conductors 34 may continue through similar wireways to such additional bays or enclosures. Tabs 44 are provided in the network and control power wireway 40 for accommodating prewired connector assemblies that mate with connector assembly 28 as described in greater detail below.

Figure 2:
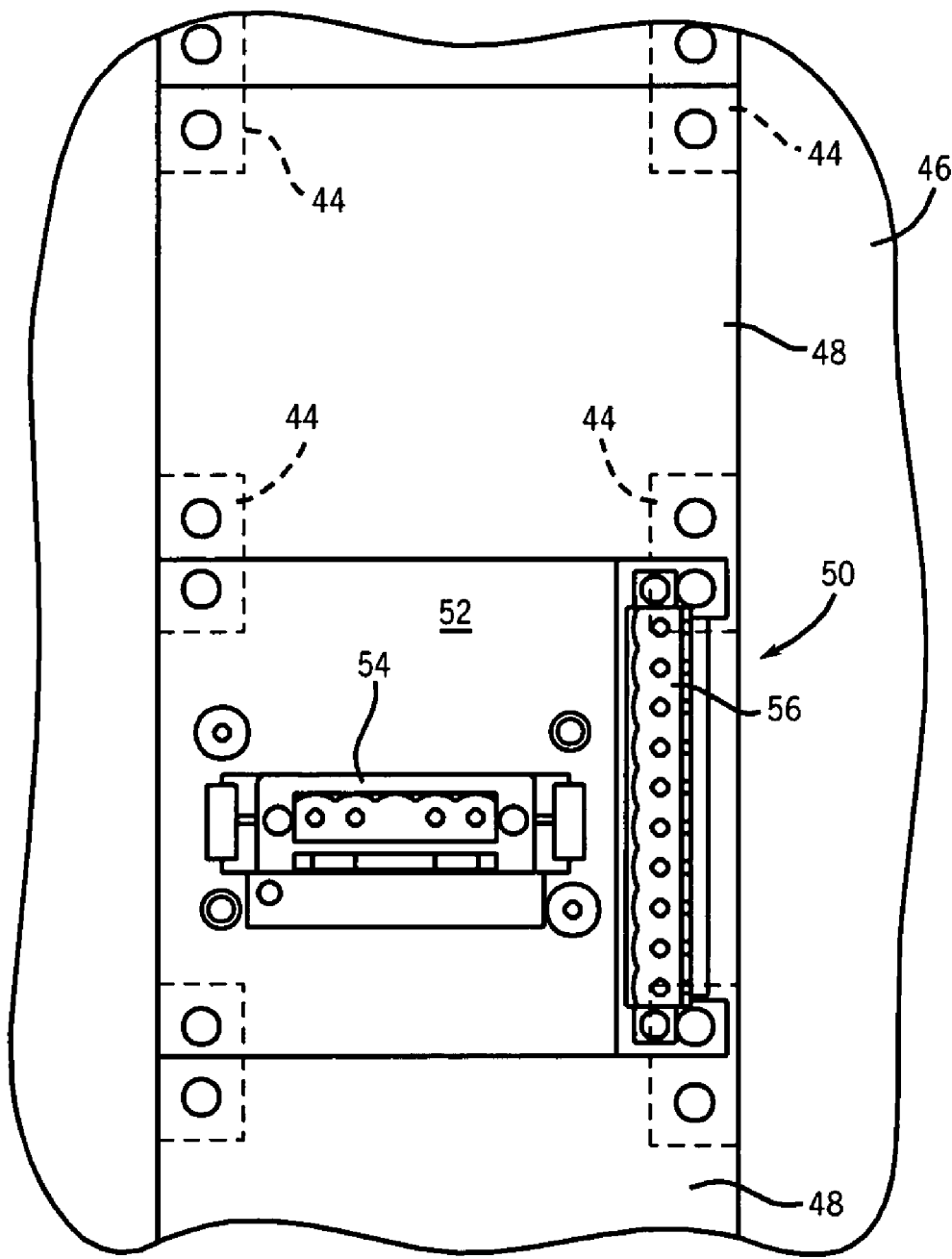
FIG. 2 is a detailed view of the prewired connector assembly installed in the enclosure of FIG. 1.

FIG. 2 represents a detailed view of the rear wall of the enclosure of FIG. 1, showing the network and control wireway formed in a rear panel 46 of the enclosure. As shown in FIG. 2, the wireway may be at least partially covered by blind plates 48 that enclose the wireway and are secured in place via appropriate fasteners to tabs 44. At the location of a component connector assembly 28 of a component support (see, FIG. 1), a prewired connector assembly 50 will be provided and similarly secured to the tabs of the wireway. Each prewired connector assembly generally includes a plate 52 on or through which a mating network connector 54 and a control power connector 56 are mounted. Connectors 54 and 56 may be of any suitable type or design. In the illustrated embodiment, the mating network connector 54 includes an orientation-sensitive receptacle having four conductors, two for data signals and two for network power. The mating control power connector 56 is also a commercially available connector including multiple conductors in an orientation-sensitive body for conveying the appropriate level of control power (e.g., 110 or 115 volt single phase power, 24 volt direct current power, and so forth). The plate 52 also supports one or more alignment devices, such as alignment pins 58 in the illustrated embodiment. These alignment devices aid in aligning the mating connectors 54 and 56 with similar connectors of the component connector assembly as described in greater detail below.

Figure 3:
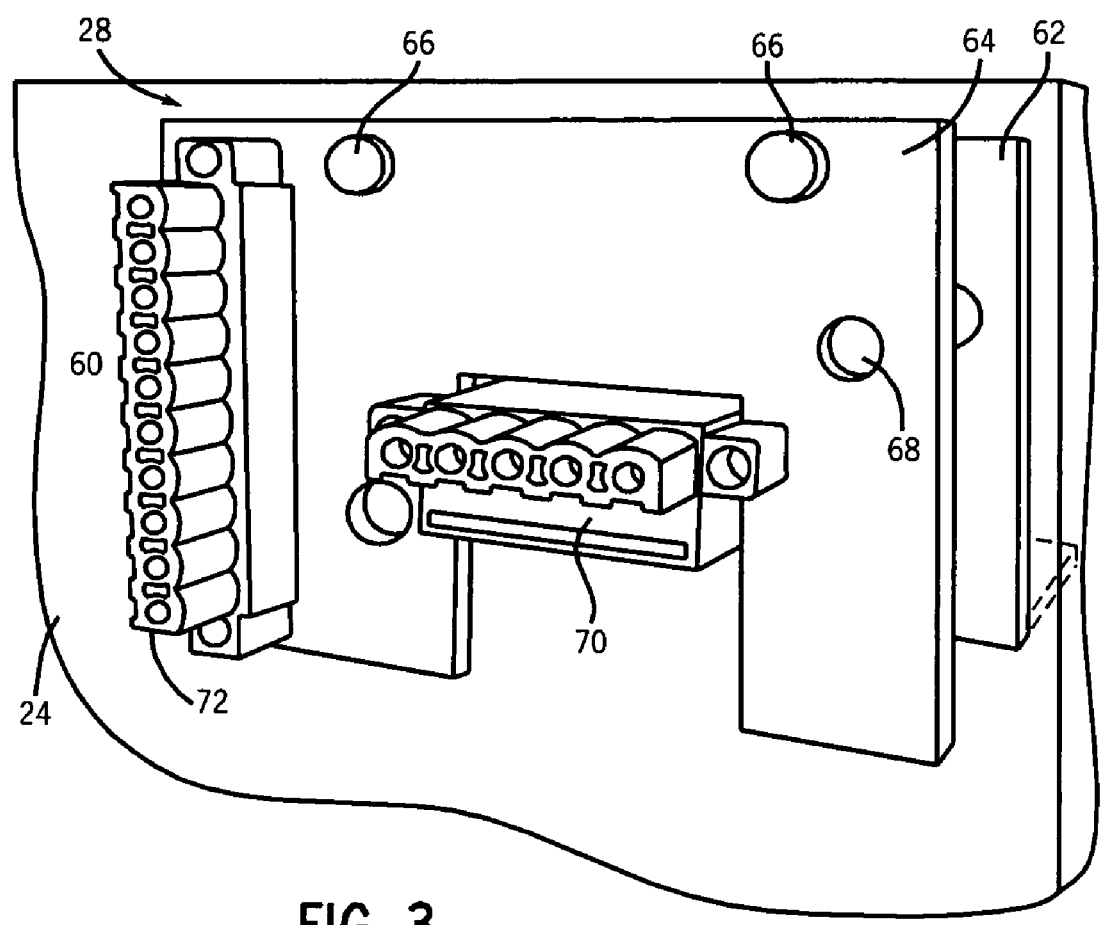
FIG. 3 is a detailed perspective view of a component connector assembly installed on a rear panel of a component support.

FIG. 3 illustrates an exemplary component connector assembly 28 of the type that can be interfaced with the prewired connector assembly 50 of FIG. 2. In the particular implementation illustrated in FIG. 3, the component connector assembly 28 is mounted on a rear panel or wall 60 of the component support 24. A fixed base plate 62 is firmly secured to the rear wall, and connected to a connector support plate 64 that is movable with respect to the base plate. Control or disengagement members 66 extend through the base plate 62 and are fixed (e.g., threaded) to the connector support plate 64 to force disengagement of the connectors as described in greater detail below. The plates include apertures or recesses 68 to accommodate the alignment pins 58 (see, FIG. 2) of the mating network connector to facilitate alignment of the connectors during engagement.

In the embodiment illustrated in FIG. 3, a pair of separate connectors are supported on the connector support plate 64. These include a network connector 70 designed to mate with the mating network connector 54 shown in FIG. 2. Plate 64 also supports a control power connector 72 specifically designed to mate with connector 56 shown in FIG. 2.

Figure 4:
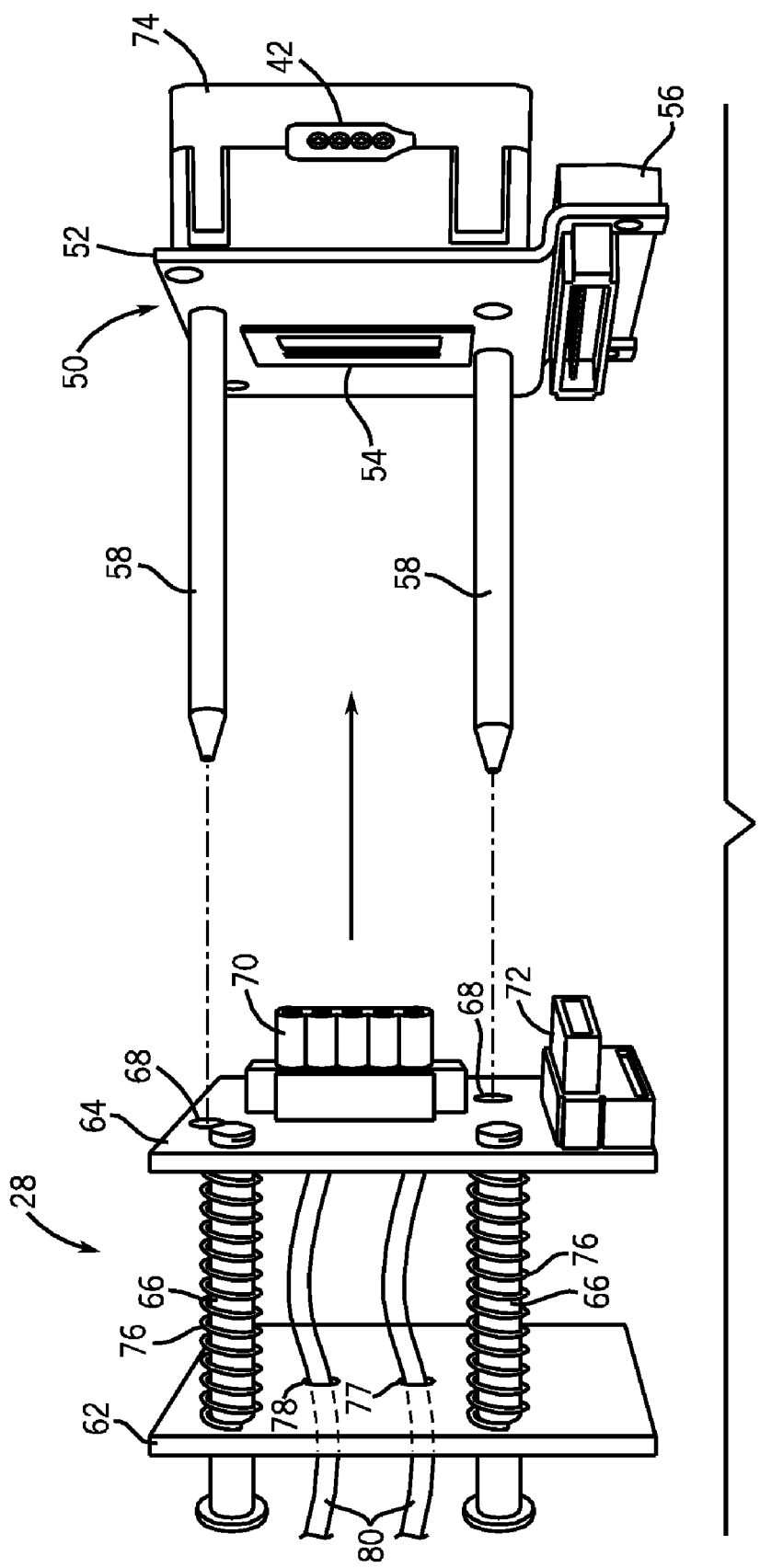
FIG. 4 is side perspective view of the connector assemblies of FIGS. 2 and 3 prior to mating.

The connectors supported on the network and control power wireway and on the component support mate as illustrated in FIG. 4. As shown in FIG. 4, the prewired connector assembly 50 generally includes a network connector body 74 the connector face of which is the mating network connector 54. In the illustrated embodiment, the network connector body 74 makes contact with conductors in the network cable 42 via insulation displacement ("vampire") pins (not shown). Other termination arrangements may, of course, be used.

On the left-hand side of FIG. 4, the component connector assembly 28 is illustrated, removed from the component support for the sake of clarity. The connector assembly 28 includes both the network connector 70 and the control power connector 72 that are coupled to wiring or cables 80 that extend through apertures 77 and 78 in the base plate 62. Similar apertures will be provided in the rear panel of the component support to permit the passage of the cables 80. The connector support plate 64 with connectors 70 and 72 supported thereon is held in a biased position by compression springs 76 that are disposed on and around the control rods or pins 66. The control rods are slidable through apertures in the base plate 62 (and similar apertures in the rear panel of the component support) to allow compression of the springs 76. Thus, the springs hold the connector support plate 64 in a normal or operative position, but the combination of the springs and of the control rods 66 allow for movement of the connector support plate (and connectors 70 and 72) with respect to the rear panel of the component support.

Figure 5:
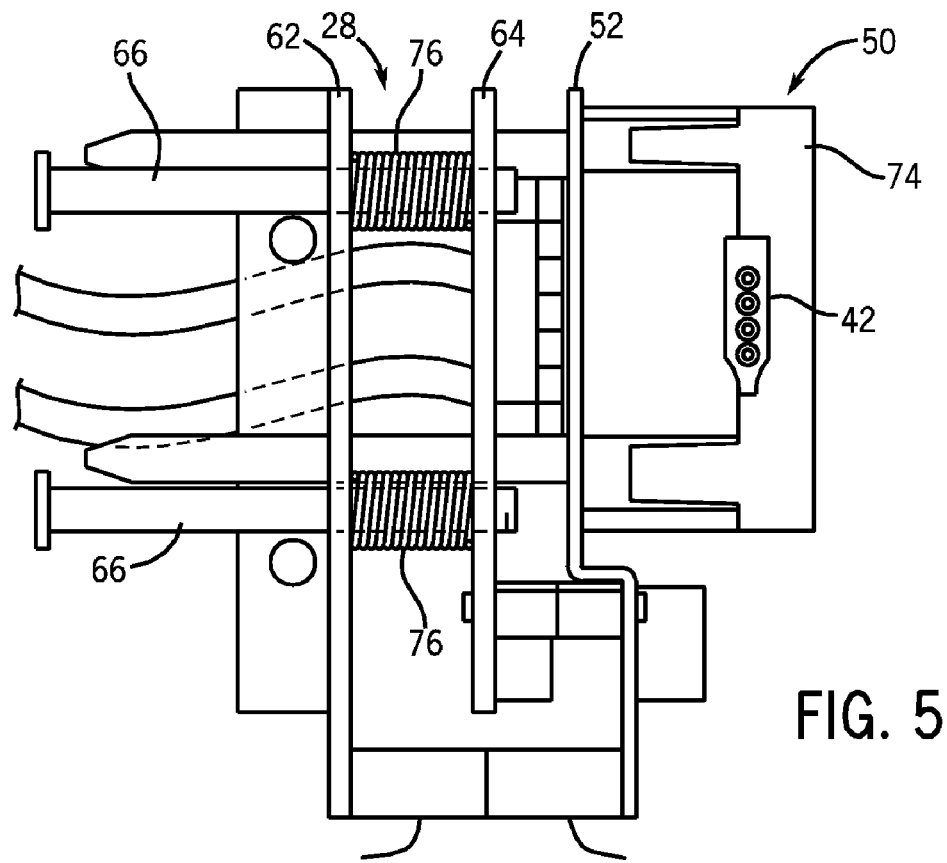
FIG. 5 is a similar side view of the connector assemblies at the point of full engagement of the component support within the enclosure to force mating of the connector assemblies.

FIG. 5 illustrates the configuration of the connectors at the time of installation and full engagement of a component support. As can be seen in FIG. 5, the springs 76 are compressed around the control rods 66, which are allowed to extend rearwardly through the base plate 62. The cables connected to connectors 70 and 72 are also free to move through the base plate. When the springs are completely compressed, a force will be exerted on the connectors 70 and 72 to cause them to engage the respective connectors 54 and 56 of the prewired connector assembly. Thereafter, the components within the component support will be supplied with network signals and control power via the mated connector assemblies.

Figure 6:
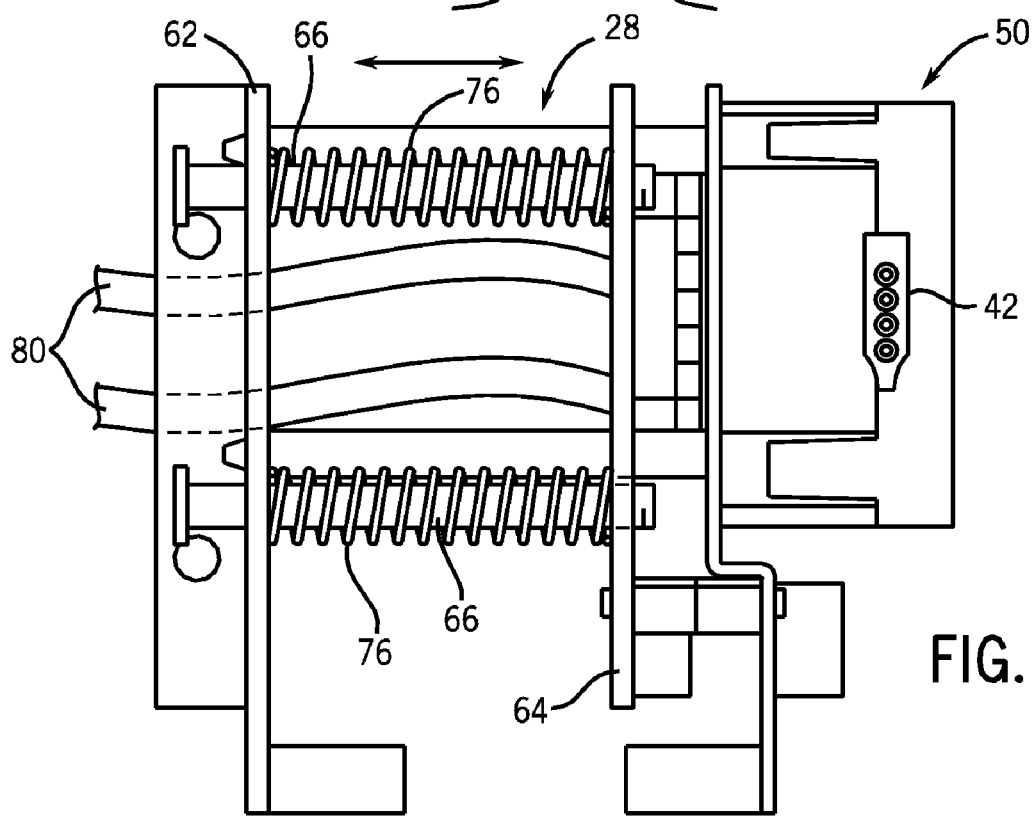
FIG. 6 is a similar side perspective view of the connector assemblies positioned at a limit of the range of movement of the component connector assembly with respect to the prewired connector assembly.

FIG. 6 illustrates the mated connector assemblies in a retracted position of the component support (not shown in FIG. 6 for the sake of clarity). Again, the base plate 62 of the component connector assembly is secured to the component support such that as the component support is partially withdrawn from the enclosure, the base plate 62 slides with respect to the control rods 66. At a maximum point of withdrawal, effectively the limit of the range provided by the length of control rods 66, the base plate 62 will contact the heads of the control rods 66 and force disengagement of the connectors from one another. The range of movement provided in the component connector assembly 28 will depend essentially upon the distance desired for uncoupling main power from the component support (via withdrawal of stabs 79A from power buses 79B).

As will be noted by those skilled in the art, once the connector assembly is described above are mated, contact between the connector assemblies is static. That is, no sliding contact takes place during either operation or during partial withdrawal for servicing of the component support from the enclosure. It has been found that such non-sliding contact between the connectors facilitates good signal transmission and avoids problems with signal degradation present in conventional sliding contacts for such applications.

Figure 7:
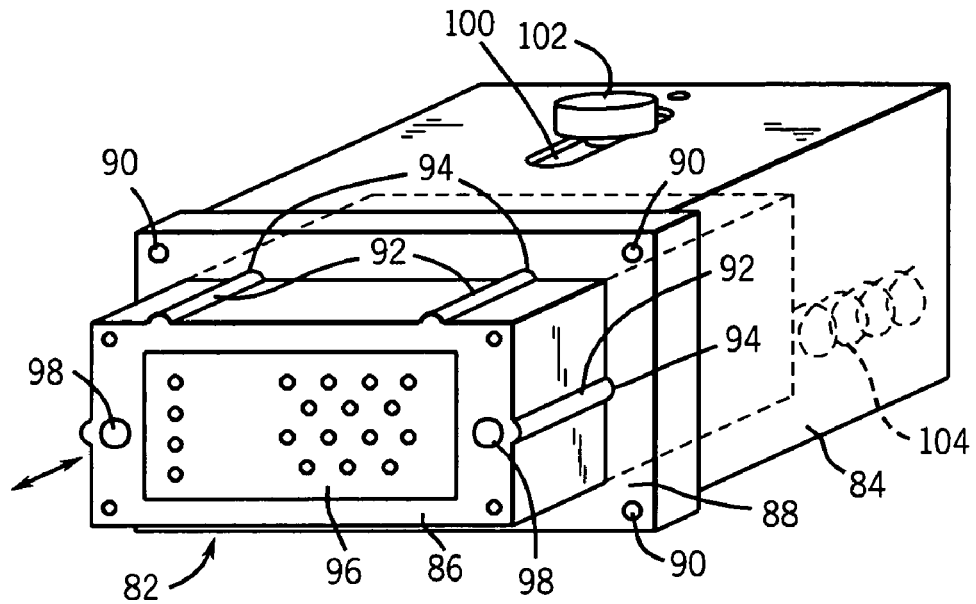
FIG. 7 is a perspective view of an alternative connector configuration for use in a component support including a single connector assembly.
Figure 8:
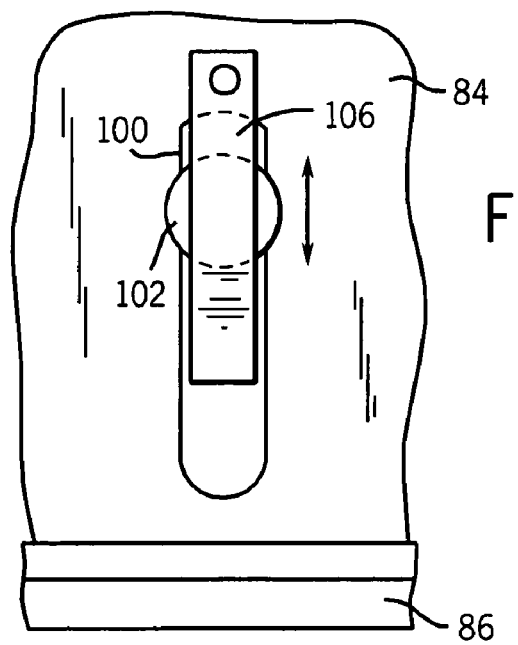
FIG. 8 is a partial top view of the connector arrangement of FIG. 7.
Figure 9:
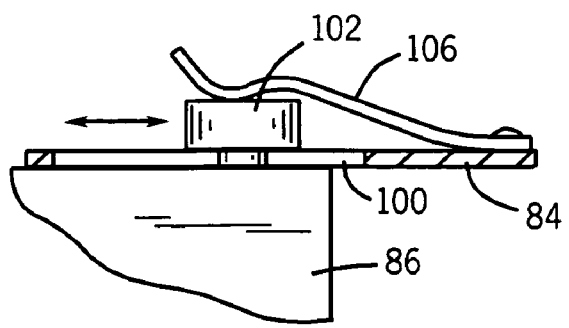
FIG. 9 is a partial side view of the connector arrangement of FIG. 8.

The foregoing arrangement allows for coupling of a component support to a connector for control power and network signals within a separated wireway using a connector assembly including more than one connector. An alternative configuration including a single connector is illustrated in FIG. 7. Although may such arrangements may be envisaged, the alternative connector assembly 82 of FIG. 7 includes a stationary part 84 designed to be affixed to the rear panel of a component support, and a movable part 86. The stationary part 84 has a flange 88 with fastener holes 90 designed to receive fasteners for fixing the stationary part on the rear panel (not shown in FIG. 7) of a component support. Guides 92 are formed on the movable part 86 to aid in guiding the movable part as it is slid within the stationary part. The guides 92 interface with recesses 94 for this purpose. The movable part 86 comprises a multi-pin plug 96 including either male, female or both types of engagement members for transmitting data signals to and from components within the component support, and for transmitting control power to the components. In the embodiment illustrated in FIG. 7, fore and aft movement of the movable part 86 is limited by a travel-limiting slot 100 in which a stop bolt 102 is positioned. The stop bolt 102 may be a shoulder fastener, for example, that is fitted to the movable part 86 through slot 100. Within the assembly, one or more biasing springs, indicated generally by reference numeral 104, serve to urge the movable part towards the operative or engaged position.

Where desired, an additional biasing member represented in FIGS. 8 and 9 may be included for interfacing with the movable part 86. In the illustrated embodiment, a spring member 106 is provided that has a contour designed to interface with the head of the stop bolt 102. That is, in either the fully or near-fully retracted position or the fully or near-fully extended position, the spring member 106 generally causes a biasing force to be applied to the movable part 86 that can be overcome to allow the movable part to be slid into or out of the stationary part 84.

Figure 10:
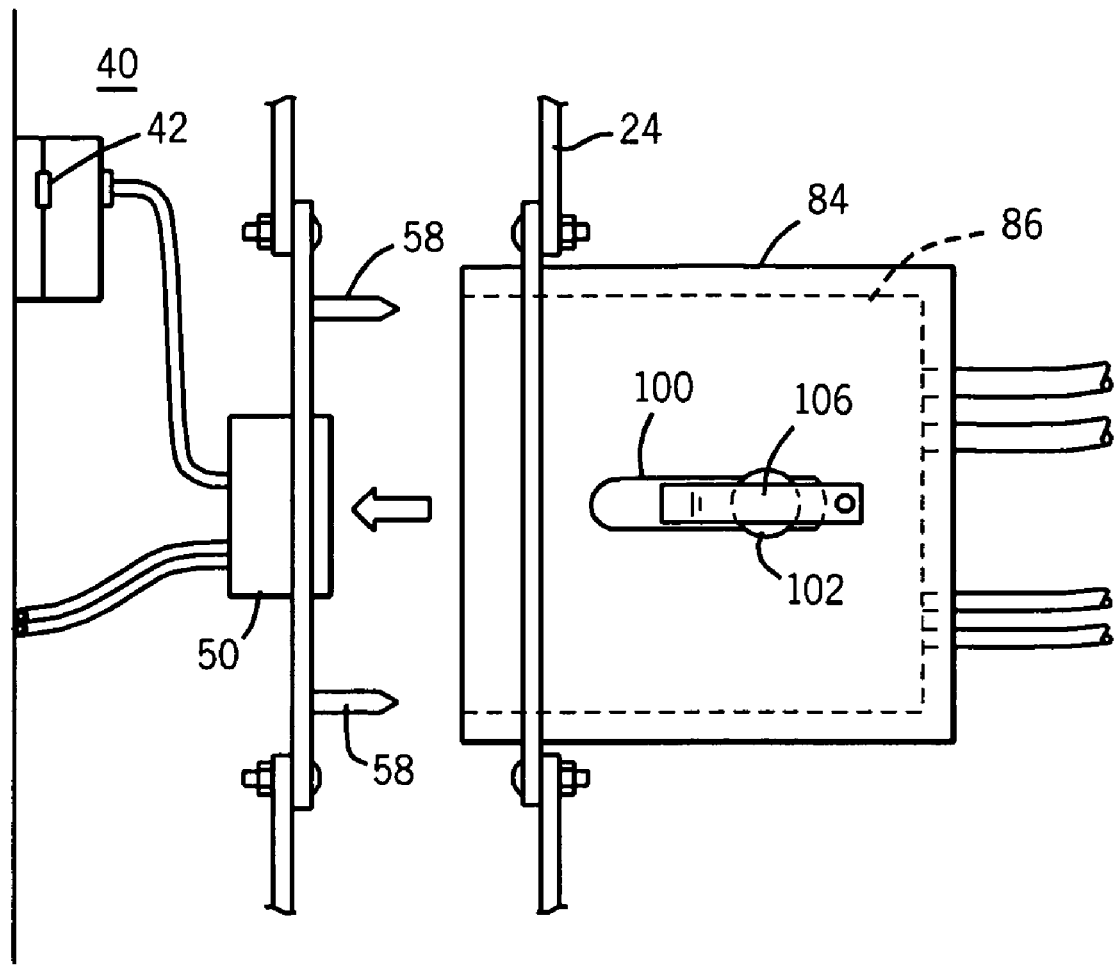
FIG. 10 is a partial top view of the connector of FIG. 7 aligned for mating with a connector in a power, in a network and control power wireway.

FIG. 10 illustrates the alternative arrangement immediately prior to making of the connections. As shown in FIG. 10, the movable part 86 of the alternative connector assembly 82 will generally be recessed within the stationary part 84. The stationary part 84 is, as noted above, secured to the rear panel of a component support as indicated by reference numeral 24. In the stop bolt arrangement of the illustrated embodiment, the bolt will bear against a rear surface of the travel-limiting slot 100. As the connector assembly approaches the prewired connector assembly 50 provided within the network and control power wireway 40, alignment pins 58 engage corresponding holes 98 (see FIG. 7) to align the connectors with one another. Further engagement of the component support within the enclosure, then, causes the connectors to be mated. Thereafter, partial retraction of the component support is possible while maintaining a static (non-sliding) connection between the mated connectors. The degree to which the component support can be withdrawn from the enclosure is, in the illustrated embodiment, defined by the length of the travel-limiting slot 100.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electrical power control system comprising:
   an enclosure for housing an electrical power component support including a main power bus;
   a prewired connector assembly disposed in the enclosure and configured to receive data signals from a network and control power from a power source; and
   a component support disposed in the enclosure, the support having stabs supported thereon matable with the main power bus to provide a main power to components supported by the support and a component connector assembly supported thereon matable with the prewired connector assembly to provide the data signals and control power to components supported by the support;
   wherein at least one of the prewired connector assembly and the component connector assembly is biased towards a normal position and movable within a predetermined range generally equal to the length of a disengagement member to maintain a non-sliding contact between the connector assemblies during displacement of the component support in the enclosure which decouples the stabs from the main power bus to disconnect main power from the components.

2. The system of claim 1, wherein the component connector assembly includes a base fixed to the component support and a movable assembly secured to but movable with respect to the base, the movable assembly being matable with the prewired connector assembly.

3. The system of claim 2, wherein the movable assembly is secured to the base via at least one disengagement member, the disengagement member causing the movable assembly to be unmated from the prewired connector assembly when the support is displaced beyond the predetermined range.

4. The system of claim 2, wherein the disengagement member includes at least one rod extending between the base and the movable assembly for causing the movable assembly to be unmated from the prewired connector assembly.

5. The system of claim 4, further comprising a biasing spring disposed around the at least one rod between the base and the movable assembly, the biasing spring urging the movable assembly towards the normal position.

6. The system of claim 2, wherein the base and the movable assembly cooperate to force mating of the movable assembly with the prewired connector assembly when the support is fully engaged into an operating position within the enclosure.

7. The system of claim 1, wherein each of the prewired connector assembly and the component connector assembly includes a plurality of connectors.

8. The system of claim 7, wherein the plurality of connectors includes separate network and control power connectors.

9. An electrical power control system comprising:
   an enclosure for housing electrical power component supports including a main power bus;
   a plurality of prewired connector assemblies disposed in the enclosure and configured to receive data signals from a network and control power from a power source; and
   a plurality of component supports disposed in the enclosure, each of the supports having stabs supported thereon matable with the main power bus to provide a main power to components supported by the support and a component connector assembly supported thereon matable with a prewired connector assembly to provide the data signals and control power to components supported by the support, wherein each of the component connector assemblies is biased towards a normal position and movable within a predetermined range generally equal to the length of a disengagement member to maintain a non-sliding contact between the component connector assembly and the respective prewired connector assembly during displacement of the respective component support in the enclosure which decouples the stabs from the main power bus to disconnect main power from the components.

10. The system of claim 9, wherein the enclosure includes a power wireway for housing three phase power conductors, and wherein the prewired connector assemblies are disposed over a wireway separate from the power wireway.

11. The system of claim 9, wherein each of the component connector assemblies includes a base fixed to the respective component support and a movable assembly secured to but movable with respect to the base, the movable assembly being matable with the respective prewired connector assembly.

12. The system of claim 11, wherein the movable assembly of each component connector assembly is secured to the base via at least one disengagement member, the disengagement member causing the movable assembly to be unmated from the prewired connector assembly when the support is displaced beyond the predetermined range.

13. The system of claim 11, wherein the disengagement member includes at least one rod extending between the base and the movable assembly for causing the movable assembly to be unmated from the respective prewired connector assembly.

14. The system of claim 13, wherein each component connector assembly further includes a biasing spring disposed around the at least one rod between the base and the movable assembly, the biasing spring urging the movable assembly towards the normal position.

15. The system of claim 11, wherein the base and the movable assembly of each component connector assembly cooperate to force mating of the movable assembly with the prewired connector assembly when the support is fully engaged into an operating position within the enclosure.

16. The system of claim 9, wherein each of the prewired connector assemblies and each of the component connector assemblies includes a plurality of connectors.

17. An electrical power control system comprising:
   an enclosure for housing electrical power component supports;
   a plurality of prewired connector assemblies disposed in the enclosure adjacent to a network and control power wireway and configured to receive data signals from a network and control power from a power source;
   a power wireway within the enclosure and separated from the network and control power wireway for housing three phase power conductors to define a main power bus; and a plurality of component supports disposed in the enclosure, each of the supports having stabs supported thereon matable with the main power bus to provide a main power to components supported by the support and a component connector assembly supported thereon matable with a prewired connector assembly to provide the data signals and control power to components supported by the support, wherein each of the component connector assemblies is biased towards a normal position and movable within a predetermined range generally equal to the length of a disengagement member to maintain a non-sliding contact between the component connector assembly and the respective prewired connector assembly during displacement of the respective component support in the enclosure which decouples the stabs from the main power bus to disconnect main power from the components.

18. The system of claim 17, wherein each of the component connector assemblies includes a base fixed to the respective component support and a movable assembly secured to but movable with respect to the base, the movable assembly being matable with the respective prewired connector assembly.

19. The system of claim 18, wherein the movable assembly of each component connector assembly is secured to the base via at least one disengagement member, the disengagement member causing the movable assembly to be unmated from the prewired connector assembly when the support is displaced beyond the predetermined range.

20. The system of claim 17, wherein each of the prewired connector assemblies and each of the component connector assemblies includes a plurality of connectors.

* * * * *